United States Patent [19]

Moss

[11] 4,432,070
[45] Feb. 14, 1984

[54] HIGH SPEED PROM DEVICE

[75] Inventor: William E. Moss, Sunnyvale, Calif.

[73] Assignee: Monolithic Memories, Incorporated, Santa Clara, Calif.

[21] Appl. No.: 307,044

[22] Filed: Sep. 30, 1981

[51] Int. Cl.³ .................. G11C 7/00; G11C 17/00
[52] U.S. Cl. .................................. 365/96; 365/189
[58] Field of Search ...................... 365/96, 94, 189

[56] References Cited

U.S. PATENT DOCUMENTS

| | | | |
|---|---|---|---|
| 3,611,319 | 10/1971 | Hyatt | 365/96 |
| 4,101,974 | 7/1978 | Immer et al. | 365/96 |
| 4,125,880 | 11/1978 | Taylor | 365/96 |

FOREIGN PATENT DOCUMENTS 1131210 10/1968 United Kingdom .................. 365/96

Primary Examiner—Stuart N. Hecker
Attorney, Agent, or Firm—Alan H. MacPherson; Steven F. Caserza; Richard Franklin

[57] ABSTRACT

A semiconductor memory device (100) utilizing a programming transistor (54) capable of switching high programming currents, and a read transistor (53) capable of sensing the state of the cell (i.e. programmed or unprogrammed). The programming transistor, utilized only when programming the cell, being rather large, is rather slow. The read transistor, utilized only when reading the cell, is constructed to be as small as possible, thereby achieving a substantially increased reading speed over prior art PROM devices which utilize a single transistor per memory cell for both programming and reading.

8 Claims, 7 Drawing Figures

HIGH SPEED PROM DEVICE

BACKGROUND OF THE INVENTION

1. Field of the Invention

This invention relates to semiconductor memory devices, and more particularly to a high speed programmable read only memory (PROM) device.

2. Description of the Prior Art

Semiconductor programmable read only memories (PROMs) are well-known in the prior art. A PROM consist of an array of memory cells, each cell in which may be programmed to store a binary "0" or "1" (a so-called binary "bit") after the PROM has been completely fabricated and assembled. Once an individual cell is programmed, it may not later be changed or "reprogrammed".

One common method of constructing PROMs is to use a bipolar transistor as the programming means. Such a bipolar transistor is shown in cross-section in FIG. 1a. Transistor 9 includes collector 13 formed in the semiconductor substrate using an impurity of a first conductivity type, base 12 formed in the collector 13 using an impurity of a conductivity type opposite to that of collector 13, and emitter 11, formed in base 12 using an impurity the same conductivity type as, but of a higher concentration than in collector 13. In this fashion, either an NPN or a PNP transistor is formed. In order to program this type of cell to represent a first binary state such as a "1" or "0" (the unprogrammed cell represents the other state), sufficient emitter-collector current must be applied to form an electrical short (i.e., a low resistance path) between emitter 11 and collector 13 through base 12. This short is shown in FIG. 1b and is labeled 14. Typical emitter-collector currents required to form short 14 depend upon a number of factors (such as base doping concentration and base width) and are in the range of 70 to 150 milliamps. It is therefore generally recommended by manufacturers of such PROMs that a programming current on the order of 200 milliamps be used, in order to ensure that desired shorts are formed in selected cells, thereby programming these cells. Due to the high programming current required, access devices associated with the programming means of each cell must be capable of handling such currents without themselves being physically damaged. For this reason, bipolar transistors, which have high current carrying ability, are used as access devices in prior art PROM devices.

FIG. 2 shows a schematic diagram of a portion of a prior art PROM device utilizing bipolar transistors as the programming means. PROM device 100 contains bit lines $B_1$ and $B_2$, and word lines $W_1$ and $W_2$. The cell accessed by word line $W_1$ and bit line $B_1$ is labeled 11. The cell accessed by word line $W_1$ and bit line $B_2$ is labeled 12. Similarly, the cell accessed by word line $W_2$ and bit line $B_1$ is labeled 21, and the cell accessed by word line $W_2$ and bit line $B_2$ is labeled 22. Each cell is similarly constructed, and thus the following discussion of cell 11 applies equally to all cells in the memory array 100.

Memory cell 11 comprises access transistor $T_{11}$ having collector 1, base 2, and emitter 3. Collector 1 is connected to bit line $B_1$, and base 2 is connected to word line $W_1$. Emitter 3 is connected to collector 4 of programming transistor $P_{11}$ as shown. $P_{11}$ is the transistor which is to be programmed to reflect the state of the cell to which it is a party. Base 5 of programming transistor $P_{11}$ is floating, and emitter 6 is connected to bias line 91. Connected to bit line $B_1$ is sense amplifier $A_1$ having output terminal $O_1$.

During the programming of memory cell 11, a short is created between collector 4 and emitter 6 of programming transistor $P_{11}$ in the following manner. Bias line 91 is connected to ground. All other bit lines at this time are kept low. Word line $W_1$ is accessed by applying to it a logical high sufficient to forward bias the base-emitter junction of transistor $T_{11}$. All other word lines are kept low at this time. Bit line $B_1$ is connected to a source of high positive potential sufficient to cause enough current to flow through transistor $P_{11}$ to short the collector-emitter junction of transistor $P_{11}$. With a high on word line $W_1$, access transistor $T_{11}$ turns on. The source of high potential connected to bit line $B_1$ is connected to collector 4 of programming transistor $P_{11}$ through access transistor $T_{11}$. Programming transistor $P_{11}$ conducts, due to the high potential connected to its collector 4, a current sufficient to cause reverse breakdown of its collector-base junction. With emitter 6 being connected to bias line 91, which is at ground, the base-emitter junction is forward biased. Programming transistor $P_{11}$ is constructed such that sufficient current is applied during programming from bit line $B_1$ to cause a permanent short to be created between collector 4 and emitter 6. Access transistor $T_{11}$ is constructed such that it can carry this programming current without itself becoming damaged. Because access transistor $T_{11}$ is rather large, the speed of cell 11 is rather low. Each cell in memory array 100 which is to be programmed is programmed by this method.

During the read operation of memory cell 11, bias line 91 is connected to ground, bit line $B_1$ is accessed by applying to it a logical high (i.e. a positive voltage sufficient to allow reading of cell 11, but insufficient to generate enough current through transistor $P_{11}$ to short the collector-emitter junction of transistor $P_{11}$), and word line $W_1$ is accessed by applying to it a logical high sufficient to forward bias the base-emitter junction of transistor $T_{11}$. With bit line $B_1$ and word line $W_1$ high, access transistor $T_{11}$ will conduct, applying the logical high from bit line $B_1$ to collector 4 of programming transistor $P_{11}$. If programming transistor $P_{11}$ has been programmed, the high applied to collector 4 will cause current to flow through the short created between collector 4 and emitter 6 of programming transistor $P_{11}$ to bias lead 91, which is at ground. The current flow through access transistor $T_{11}$ and programming transistor $P_{11}$ to ground causes bit line $B_1$ to be pulled low. This low is applied to sense amplifier $A_1$, resulting in an output signal being applied to output terminal $O_1$ indicative of the fact that programming transistor $P_{11}$ has been programmed (i.e. has a short circuit). On the other hand, if programming transistor $P_{11}$ had not been programmed, current would not flow between collector 4 and emitter 6 of programming transistor $P_{11}$, because base 5 is not high. Thus, when an unprogrammed cell 11 is accessed, bit line $B_1$ will remain high. This high is applied to amplifier $A_1$, and the output signal available at $O_1$ is indicative of memory cell 11 being unprogrammed.

A major difficulty associated with this prior art method of utilizing bipolar transistors as programming means is that each access transistor associated with a single programming transistor must be capable of carrying the high programming current without itself being damaged. Since the current required to program a bipolar transistor is on the order of 200 milliamps, the access transistor of prior art PROMs must be constructed to be rather large in order to be able to handle 200 milliamps without incurring any damage when the memory cell is programmed by fusing a transistor junction. Because of the required large size of the access transistors of such prior art PROMs, the speed of such prior art PROMs is rather low.

Another prior art method of constructing PROMs is to utilize refractory metal, such as nichrome, titanium-tungsten, or polycrystalline silicon, in such a manner as to form a fusible link. Such a fusible link is shown in FIGS. 3a and 3b. Fusible link 71 contains narrow region 72 such that region 72 acts as a fuse. When sufficient current is caused to flow through narrowing 72, the material is melted, thus forming opening 73 as shown in FIG. 3b. The circuit of FIG. 2 can be used to construct a PROM utilizing fusible links, where each programming transistor $P_{11}$, $P_{12}$, $P_{21}$, and $P_{22}$ is replaced by a single fusible link. Programming and reading takes place in precisely the same manner as in the circuit shown in FIG. 2, with the exception that programmed cells contain open fuses rather than shorted transistors. Typical current required to blow open a fusible link is again on the order of 70 to 200 milliamps. Thus, this technique also requires that each access transistor be rather large in order to carry the current required to program each fusible link without itself incurring any damage; the speed of such prior art PROM devices utilizing fusible links is rather slow.

Prior art PROMs are disclosed, for example, in U.S. Pat. Nos. 3,191,151; 3,733,690; 3,742,592 and 3,848,238.

SUMMARY OF THE INVENTION

In accordance with this invention, prior art difficulties in the manufacture of high speed programmable read only memories are overcome by utilizing a programming transistor capable of switching high programming currents, and a read transistor capable of sensing the state of the cell (i.e. programmed or unprogrammed). The programming transistor, utilized only when programming the cell, being rather large, is rather slow. The read transistor, utilized only when reading the cell, is constructed to be as small as possible, thereby achieving a substantially increased reading speed over prior art PROM devices which utilize a single transistor per memory cell for both programming and reading.

DETAILED DESCRIPTION

Figure 2:
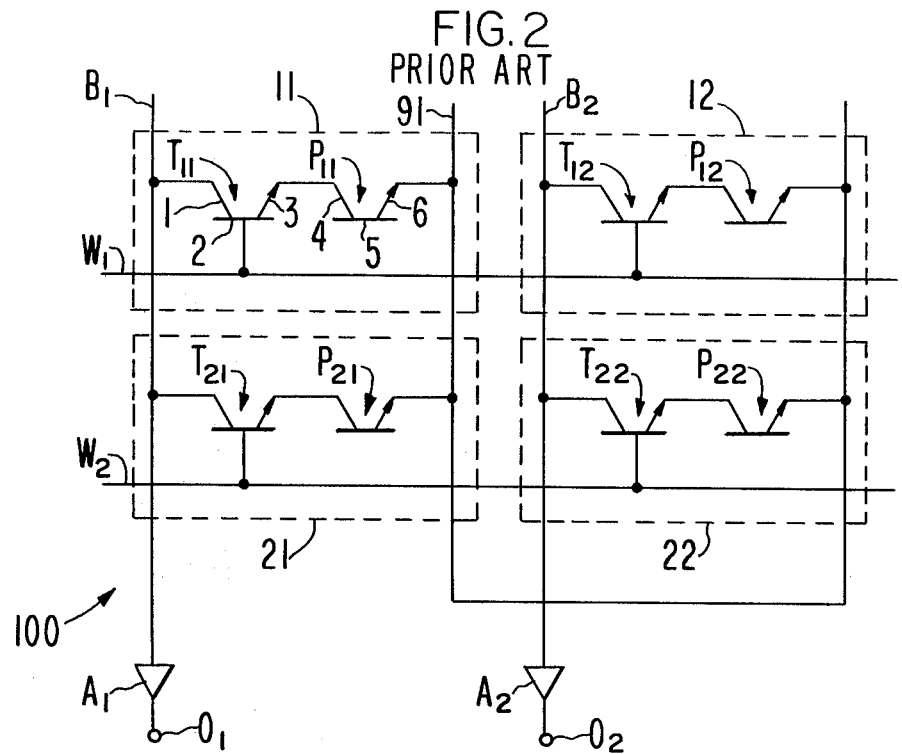
FIG. 2 shows a schematic diagram of a prior art PROM device which utilizes a single accessing transistor per cell for both programming and read operations.
Figure 1A:
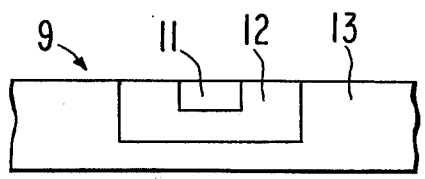
FIGS. 1a and 1b show in cross-section a bipolar transistor of the prior art before and after programming.
Figure 3A:
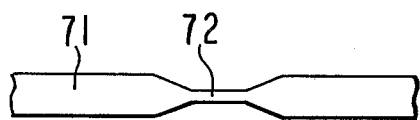
FIGS. 3a and 3b show a top-view of a prior art fusible link.
Figure 1B:
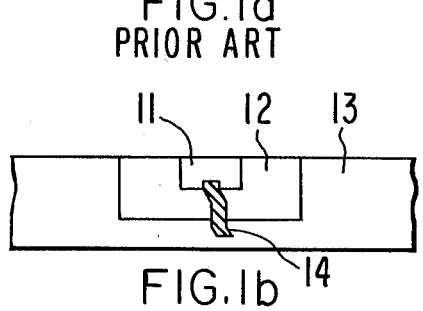
Figure 3B:
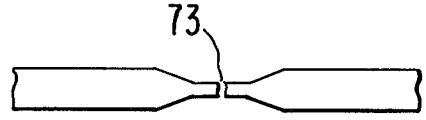
Figure 4:
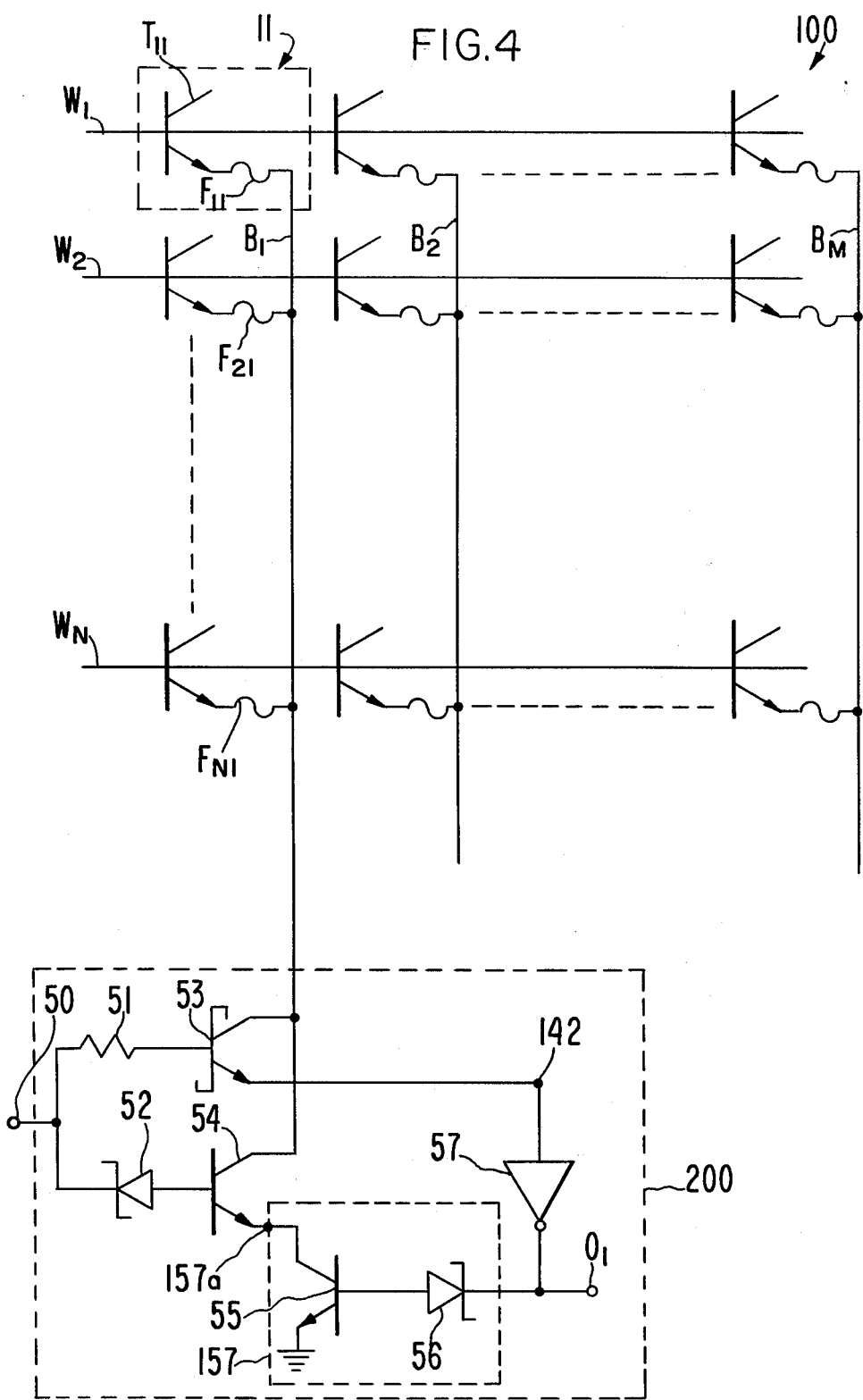
FIG. 4 is a schematic diagram of a PROM device constructed in accordance with this invention.

A schematic diagram of a PROM device constructed in accordance with this invention is shown in FIG. 4. PROM device 100 comprises a plurality of N word lines, $W_1$, $W_2$, ... $W_N$ and a plurality of M bit lines, $B_1$, $B_2$ ... $B_M$. A plurality of N X M cells are formed, with each cell being formed at the "intersection" of a single word line and a single bit line. For example, cell 11 is formed at the "intersection" of word line $W_1$ and bit line $B_1$. Note that word line $W_1$ and bit line $B_1$ are not directly connected, but rather are connected only through transistor $T_{11}$ and fusible link $F_{11}$. Fusible link $F_{11}$ may comprise nichrome, polycrystalline silicon, titanium tungsten, a fusible diode or a transistor junction, or any suitable means which is capable of being changed from one state to another state (such as from a short circuit to an open circuit) during programming. Each of the cells of the array functions in indentical manner to cell 11. Thus only the operation of cell 11 will be discussed.

Connected to bit line $B_1$ is programming and sensing means 200. Programming and sensing means 200 serves to program the various fusible links $F_{11}$, $F_{21}$, ... $F_{N1}$ connected to bit line $B_1$. Programming and sensing means 200 also serves to sense the logical state (i.e, programmed or unprogrammed) of each fusible link $F_{11}$ through $F_{N1}$ connected to bit line $B_1$. It is to be understood that programming and sensing means identical to means 200 is connected to each bit line $B_1$, $B_2$, ... $B_M$ in order to provide programming and sensing functions for each cell of the array. However, in this specification only the operation of programming and sensing means 200 will be described.

Typically the structure shown schematically in FIG. 4 is formed as an integrated circuit on a single chip of silicon semiconductor material.

The programming of cell 11 will now be described. It is to be understood that each cell within the array of PROM 100 is programmed in a similar manner. The collector of transistor $T_{11}$ is connected to a positive voltage supply $V_{CC}$, as are the collectors of each of the N x M transistors contained in the N x M memory cells of PROM device 100. The base of transistor $T_{11}$ is connected to word line $W_1$. Word line $W_1$, which connects to the to-be-programmed memory cell 11, is enabled by connection to a positive voltage (logical 1) (not shown). All other word lines $W_2$ through $W_N$ are disabled by connection to a low voltage (logical 0). This low voltage applied to disable word lines $W_2$-$W_N$ turns off each transistor connected to word lines $W_2$-$W_N$, thus disabling all transistors connected to word lines $W_2$-$W_N$.

During programming of cell 11, the positive supply voltage $V_{CC}$ applied to the collector of $T_{11}$ is increased to approximately 12 volts, as compared with the typical value of 5 volts used during the read operation of the device. During programming of cell 11, the output terminal $O_1$ (part of programming and sensing means 200) is also connected to 12 volts if it is desired to change fusible link $F_{11}$ to an open circuit, and the output terminal $O_1$ is connected to ground (or a voltage less than approximately 6–7 volts, the breakdown voltage of zener diode 56) if it is desired to maintain fusible link $F_{11}$ as a short circuit.

Figure 5:
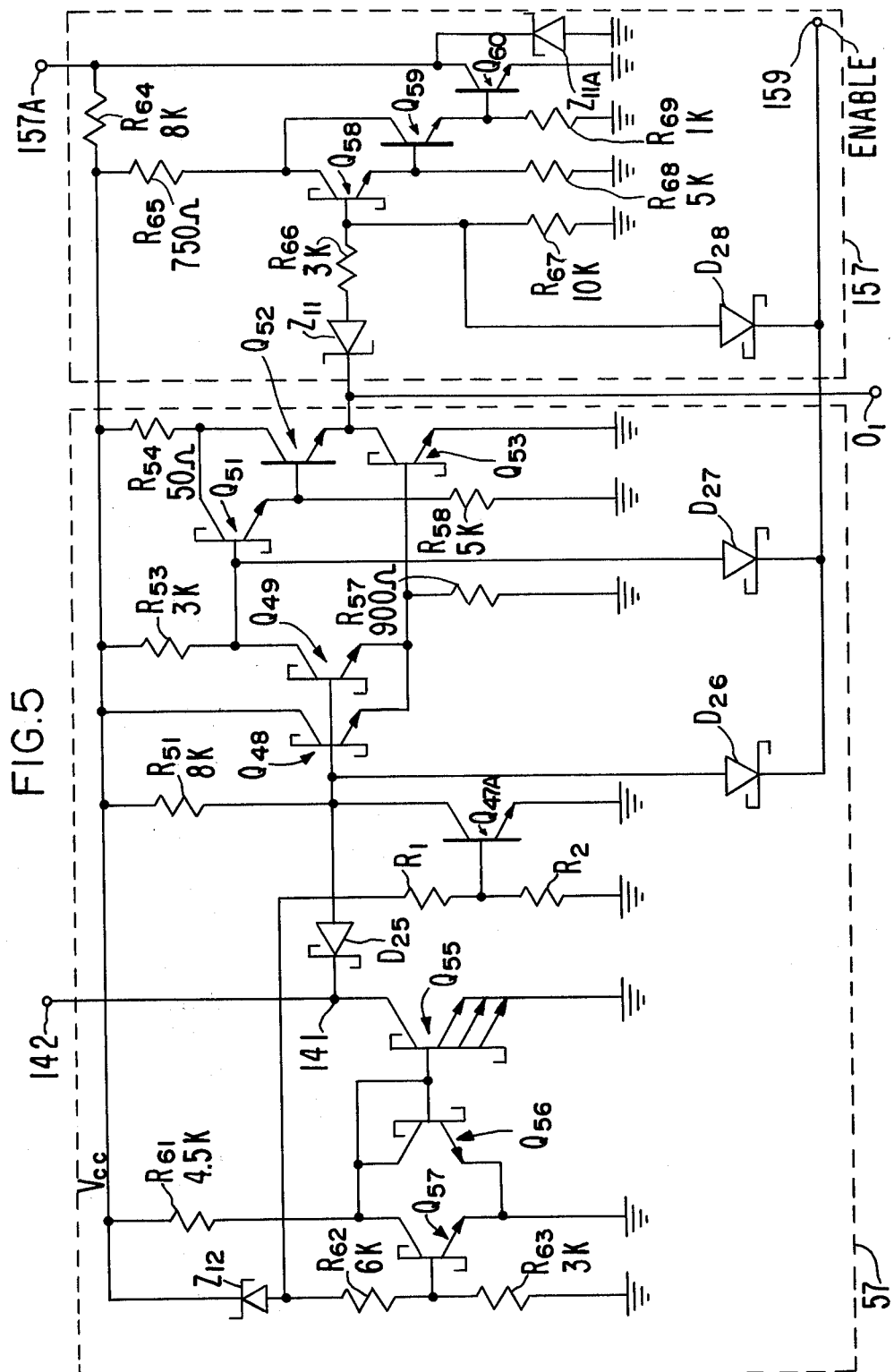
FIG. 5 is a detailed schematic diagram of portions of the circuit of FIG. 4.

The application of $V_{CC}$ of 12 volts to the PROM device causes inverter 57 to become disabled, with the input lead and the output lead of inverter 57 floating. The disabling circuitry of inverter 57 is of a type well known to those skilled in the art. An example of a circuit which is used as inverter 57 is shown in FIG. 5, discussed below. During programming, $V_{CC}=12$ volts is also applied to terminal 50. Terminal 50 is connected to the base of transistor 53 through resistor 51 (approximately 3000 ohms). During programming, the input lead of inverter 57 is disabled, thus causing the emitter of transistor 53 to float. Thus, transistor 53 remains turned off during programming.

During the programming operation, an entire word accessed by word line $W_1$ is programmed simultaneously. Thus, each fusible link accessed by word line $W_1$ is programmed simultaneously by the application of bits forming the word to be stored on word line $W_1$ applied to output terminals $O_1$ through $O_M$. Of importance, if the PROM device of this invention is in the programming mode (i.e. $V_{CC}$ raised to approximately 12 volts) each fusible link connected to the enabled word line will be programmed, or changed from a short circuit to an open circuit, only if the voltage on its associated output terminal $O_1 \ldots O_M$ is equal to approximately 12 volts.

To program cell 11 to a logical 1 (open fusible link $F_{11}$), word line $W_1$ is accessed and a programming voltage of approximately 12 volts is applied to output terminal $O_1$. During programming ($V_{CC} \cong 12$ volts), the input lead of inverter 57 is floating (high impedance). Thus, inverter 57 will not sink emitter current from NPN transistor 53, thus keeping transistor 53 turned off during programming. Zener diode 56, having a zener breakdown voltage of approximately 6 volts, conducts, thus forward biasing the base-emitter junction of transistor 55, thereby causing transistor 55 to conduct. At the same time, $V_{CC}$ is supplied to terminal 50. With $V_{CC} = 12$ volts applied to terminal 50, zener diode 52, having a zener breakdown voltage of approximately 6 volts, conducts, thus forward biasing the base-emitter junction of transistor 54, thereby turning on transistor 54. Approximately 50 milliamps of current then flows from the collector of transistor $T_{11}$ contained within memory cell 11 (connected to $V_{CC} = 12$ volts), through transistor $T_{11}$, through fusible link $F_{11}$, and through transistors 54 and 55 to ground. During programming, which takes approximately 1 millisecond, fusible link $F_{11}$ is changed from a short circuit (a first selected state such as a logical 0) to an open circuit (a second selected state such as a logical 1).

On the other hand, when it is desired to program word line $W_1$ and maintain cell 11 in the first selected state (arbitrarily defined to be a logical 0 corresponding to a shorted fusible link $F_{11}$), a programming voltage of approximately 0 volts (or any voltage less than the zener breakdown voltage of zener diode 56) is applied to output node $O_1$. Zener diode 56 wil not conduct, transistor 55 will not be turned on, and thus current will not be drawn through fusible link $F_{11}$. Fusible link $F_{11}$ will thus remain a short circuit indicating that a logical 0 is stored in memory cell 11.

Each word stored within PROM 100 is programmed in a similar manner, by applying $V_{CC} \cong 12$ volts to the collector of the transistors corresponding to $T_{11}$ in each cell connected to the word line $W_i$, enabling the corresponding word line $W_i$ (where i is an integer given by $1 \leq i \leq N$) to be programmed, and applying a high voltage of approximately 12 volts to those output terminals $O_1$-$O_M$ corresponding to those bits of the selected word which are to be stored as logical ones (i.e. those bits to have the link corresponding to link $F_{11}$ open-circuited), with all other output terminals being connected to a low voltage of approximately zero volts.

During the read operation of the PROM device of this invention, the positive supply voltage $V_{CC}$ applied to the PROM device is equal to approximately 5 volts. Approximately 5 volts is thus available on the collector of transistor $T_{11}$ of cell 11 and all other corresponding transistors of the memory array. $V_{CC}$ of 5 volts is also applied to terminal 50. Because the voltage applied to terminal 50 is less than the six (6) volt zener breakdown voltage of zener diode 52, zener diode 52 does not conduct and programming transistor 54 is not turned on during the read operation. Similarly, the highest output voltage available from inverter 57 is approximately $V_{CC} = 5$ volts; thus zener diode 56, having a zener breakdown voltage of 6 volts, does not conduct and transistor 55 is not turned on during the read operation.

However, during the read operation, the $V_{CC}$ of 5 volts applied to terminal 50 is also applied through resistor 51 (approxmately 3000 ohms) to the base of transistor 53. This voltage applied to the base of transistor 53 is sufficient to forward bias the base-emitter junction of transistor 53, thus causing transistor 53 to turn on. Using suitable well-known addressing techniques, the desired word line $W_i$ is enabled by connection to a logical one (a positive voltage), and all other word lines are disabled by connection to a logical zero. For example, if it is desired to read the contents of memory cell 11, word line $W_1$ is enabled by placing a positive voltage on word line $W_1$. All other word lines $W_2$ through $W_N$ are disabled by their connection to a logical low, typically zero volts. If fusible link $F_{11}$ is intact (i.e. unprogrammed, or a short circuit), with the base of access transistor $T_{11}$ connected to a logical high, the base-emitter junction of access transistor $T_{11}$ will be forward biased and transistor $T_{11}$ will conduct, thereby applying a positive voltage on the collector of transistor 53. With approximately 5 volts applied to the collector of transistor 53, and transistor 53 turned on during the read operation, as previously described, sufficient current is provided to the input of inverter 57 to generate a logical low signal on the output lead of inverter 57, which serves as the output signal on output terminal $O_1$ representing the state of cell 11.

On the other hand, if fusible link $F_{11}$ in cell 11 has been programmed to be an open circuit, transistor $T_{11}$ cannot turn on, and the positive voltage applied to the collector of transistor $T_{11}$ will not be applied to the collector of transistor 53. With the collector of transistor 53 floating, the current applied to the input lead of inverter 57 is due to the forward biased base-emitter junction of transistor 53. This base-emitter current is negligible (approximately 400 microamps) thus causing the output voltage of inverter 57 to go high, thereby providing a logical 1 of approximately 5 volts on the output terminal $O_1$, thus indicating that the fusible link $F_{11}$ in cell 11 is programmed to be an open circuit. As previously mentioned, this output voltage of 5 volts is insufficient to cause zener breakdown of zener diode 56, which has a zener breakdown voltage of approximately 6 volts. Thus, zener diode 56, and programming transistor 55 remain non-conducting during the read operation.

In order to allow for high speed reading, the read transistor 53 of this invention is preferably a Schottky transistor, such as is well known in the semiconductor arts. The operation of a Schottky transistor is well known an provides increased switching speeds over conventional bipolar and MOS transistors.

Thus, it is seen that during the reading of the PROM of this invention, the slow transistors which are capable of handling large programming currents (such as transistors 54 and 55 used to program the cells in column 1) are inactive and the reading is carried out by smaller, fast transistor 53. On the other hand, when a cell is being programmed, read transistor 53 and inverter 57 are disabled and thus not exposed to potential damage by the large currents used during the destruction of fusible link $F_{11}$.

In another embodiment of this invention, the subcircuit 157 comprising NPN transistor 55 and zener diode 56 of programming and sensing means 200 (FIG. 4) is replaced by circuit 157 shown in FIG. 5. When a programming voltage (typically 12 volts) is applied to output terminal $O_1$ which exceeds the zener breakdown voltage of zener diode $Z_{11}$ (typically 6 volts), diode $Z_{11}$ conducts, thus providing base current through resistor $R_{66}$ (3K ohms) to transistor $Q_{58}$. The base of NPN transistor $Q_{58}$ is normally kept low by transistor $R_{67}$ (10K ohms) connected to ground, and the emitter of transistor $Q_{58}$ is connected to ground through resistor $R_{68}$ (5K ohms). The base current to transistor $Q_{58}$ provided by a programming voltage on output terminal $O_1$ turns transistor $Q_{58}$ on, thus drawing current from $V_{CC}$ to ground through collector resistor $R_{65}$ (750 ohms) and emitter resistor $R_{68}$ (5K ohms). This causes the base of NPN transistor $Q_{59}$ to go high, thus turning on transistor $Q_{59}$. Transistor $Q_{59}$ thus draws collector current from $V_{CC}$ to ground through collector resistor $R_{65}$ and emitter resistor $R_{69}$ (1K ohm). This causes a high voltage to be placed on the base of NPN transistor $Q_{60}$. Because the emitter of transistor $Q_{60}$ is grounded, transistor $Q_{60}$ thus turns on, thus drawing a large amount of programming current (approximately 50 ma) from terminal 157A. As shown in FIG. 4, terminal 157A is connected to the emitter of transistor 54, which as previously described is on during programming. Thus, this programming circuit is drawn from $V_{CC}$, through access transistor $T_{11}$, through fusible link $F_{11}$, through bit line $B_1$, through transistor 54, and sub-circuit 157 to ground, thus causing the fusion, or opening of fusible link $F_{11}$, when memory cell 11 is programmed. Resistor $R_{64}$ (8K ohms) connected between $V_{CC}$ and the collector of transistor $Q_{60}$ serves to provide a high voltage ($V_{CC}$) to terminal 157A when transistor $Q_{60}$ is turned off (i.e. during non-programming and during programming when a low voltage is applied to output terminal $O_1$). This high voltage on terminal 157A is applied to the emitter of transistor 54 (FIG. 4) thus keeping transistor 54 turned off and reducing the capacitance of transistor 54, thus increasing the speed of the circuit when transistor $Q_{60}$ is off. The zener diode $Z_{114}$, having a zener breakdown voltage of approximately 6 volts, is connected between the collector of transistor $Q_{60}$ and ground, and serves to maintain the voltage on terminal 157A at approximately 6 volts during programming ($V_{CC} \cong 12$ volts) when transistor $Q_{60}$ is off (logical low on output terminal $O_1$, or enable terminal 159 low), in order to prevent breakdown of the emitter-base junction of transistor 54 (FIG. 4). Schottky diode $D_{28}$, having a forward voltage of approximately 0.4 volts is connected between the base of transistor $Q_{58}$ and enable terminal 159 and serves to keep transistors $Q_{58}$, $Q_{59}$ and $Q_{60}$ turned off during times when a high enable signal is not present on enable terminal 159. With a low voltage (0 volts) applied to enable terminal 159, a high voltage (12 volts) applied to the output terminal $O_1$ will not cause the base of transistor $Q_{58}$ to exceed approximately 0.4 volts, thus keeping transistor $Q_{58}$ turned off. With transistor $Q_{58}$ off, transistors $Q_{59}$ and $Q_{60}$ also remain turned off. Thus, programming does not take place when a logical low is applied to enable terminal 159.

A detailed schematic diagram of inverter 57 (FIG. 4) is shown in FIG. 5. Resistor $R_{61}$ (4.5K ohms) is connected to the collector and base of NPN transistor $Q_{56}$, whose emitter is connected to ground. This causes transistor $Q_{56}$ to turn on, and provide a substantially constant bias voltage to the base of NPN transistor $Q_{55}$. The emitters of transistor $Q_{55}$ are connected to ground and transistor $Q_{55}$ serves as a current source tending to pull down node 141 to ground. When $V_{CC}$ is raised to the programming voltage (approxmately 12 volts), zener diode $Z_{12}$ (having a zener breakdown voltage of approximately 6 volts) conducts, thus supplying current to resistors $R_{62}$ (6K) and $R_{63}$ (3K), thus providing a base voltage to NPN transistor $Q_{57}$. This causes transistor $Q_{57}$ to conduct thus grounding the bases of transistors $Q_{55}$ and $Q_{56}$, thus turning off transistors $Q_{55}$ and $Q_{56}$. With transistor $Q_{55}$ turned off during programming input terminal 142 provides a high impedance input lead of inverter 57. Node 141, connected to terminal 142, serves as the input node of inverter 57, as shown in FIG. 4.

During reading ($V_{CC} \cong 5$ volts), with a low voltage placed on input terminal 142 of inverter 157, input node 141 is pulled low by current source transistor $Q_{55}$. The low voltage on node 141 causes Schottky diode $D_{25}$ to conduct current from $V_{CC}$ through resistor $R_{51}$ (8K), thus maintaining the bases of NPN Schottky transistors $Q_{48}$ and $Q_{49}$ low. Thus, transistors $Q_{48}$ and $Q_{49}$ do not conduct, and the voltage applied to the base of transistor $Q_{53}$ is kept low by resistor $R_{57}$ (900 ohms) connected between the base of transistor $Q_{53}$ and ground. Thus, transistor $Q_{53}$ does not conduct. However, with transistor $Q_{49}$ turned off, a high voltage is placed on the base of NPN transistor $Q_{51}$ from $V_{CC}$ through resistor $R_{53}$ (3K). The emitter of transistor $Q_{51}$ is connected to the base of NPN transistor $Q_{52}$ and to ground through resistor $R_{58}$ (5K). Thus, transistor $Q_{51}$ turns on, thus drawing collector current from $V_{CC}$ through resistor $R_{54}$ (50 ohms), and thus providing a high voltage on the base of NPN transistor $Q_{52}$. Thus, transistor $Q_{52}$ turns on, providing a low impedance path between $V_{CC}$ through resistor $R_{54}$ (50 ohms) through transistor $Q_{52}$ to output terminal $O_1$. Thus, with a low signal applied to input terminal 142 of inverter 57, a high-voltage signal is placed on output terminal $O_1$ of inverter 57. In fact, with a logical zero applied to input terminal 142, transistor $Q_{49}$ is not completely off, but rather conducts a small amount of current. Resistor $R_{57}$ may be replaced by a resistor of approximately 6000 ohms, and an additional NPN Schottky transistor (not shown) having its emitter grounded, its base connected to the emitters of transistors $Q_{48}$ and $Q_{49}$ through a first 900 ohm resistor and its collector connected to the emitters of transistors $Q_{48}$ and $Q_{49}$ through a second 900 ohm resistor. With transistor $Q_{49}$ non-conducting (logical zero on input terminal 142), this alternative circuitry decreases the collector current through transistor $Q_{49}$, thus decreasing the voltage drop across resistor $R_{53}$, thereby increasing the voltage applied to the base of transistor $Q_{51}$. Because the output voltage corresponding to a logical one on terminal $O_1$ is two forward biased diode voltage drops less than the voltage on the base of transistor $Q_{51}$ (i.e. the base-emitter voltage drops of transistors $Q_{51}$ and $Q_{52}$), the output voltage corresponding to a logical one on terminal $O_1$ is increased as compared to the logical one output voltage of the circuit of FIG. 5.

On the other hand, if during reading ($V_{CC} \cong 5$ volts) a logical high signal is placed on input terminal 142 of inverter 57, current source $Q_{55}$ is unable to maintain node 141 at ground, and thus Schottky diode D25 does not conduct. Thus, a high voltage is placed on the bases of transistors $Q_{48}$ and $Q_{49}$ from $V_{CC}$ through resistor $R_{51}$, thus causing transistors $Q_{48}$ and $Q_{49}$ to turn on. With transistors $Q_{48}$ and $Q_{49}$ conducting, a voltage sufficient to forward bias the base-emitter junction of transistor $Q_{53}$ is applied to the base of transistor $Q_{53}$, thus causing transistor $Q_{53}$ to conduct, which in turn grounds output node $O_1$. With transistor $Q_{53}$ conducting, the voltage on the base of transistor $Q_{53}$ (approximately 0.6 volts), and the voltage on the collector of transistor $Q_{49}$ (approximately 0.7 volts) are sufficiently low to prevent transistors $Q_{51}$ and $Q_{52}$ from turning on. Thus, with a logical high placed on input terminal 142 of inverter 57, a low impedance logical low is placed on output terminal $O_1$ inverter 57.

During programming, $V_{CC}$ is raised to approximately 12 volts. This causes zener diode $Z_{12}$, having a zener breakdown voltage of approximately 6 volts, to conduct thus causing current to flow through resistors $R_1$ (6000 ohms) and $R_2$ (3 Kohms) to ground. The voltage at the node between $R_1$ and $R_2$ is applied as a base voltage to NPN transistor $Q_{47A}$, causing transistor $Q_{47A}$ to conduct and saturate, thus decreasing the voltage on the bases of transistors $Q_{48}$ and $Q_{49}$ to approximately zero volts. Similarly, during programming, a logical low is placed on enable terminal 159, thus causing Schottky diodes $D_{26}$ and $D_{27}$ to pull down the voltages on the bases of transistors $Q_{48}$ and $Q_{49}$, and the voltage on the base of transistor $Q_{51}$, respectively. Thus, during programming transistors $Q_{48}$, $Q_{49}$, and thus transistor $Q_{53}$ are turned off. Also during programming, transistors $Q_{51}$ and thus transistor $Q_{52}$, are turned off. Thus, during programming, output terminal $O_1$ is neither a logical low or a logical high, but rather is floating such that a high impedance is presented between output terminal $O_1$ and $V_{CC}$ and ground within inverter 57. The fact that output terminal $O_1$ is floating during programming means that the programming signal applied externally to output node $O_1$ is applied to subcircuit 157 without being influenced by inverter 57. Thus, during programming a high or low programming signal is not generated on output terminal $O_1$ by inverter 57, but rather must be applied externally in accordance with the program desired to be stored within the PROM device of this invention.

While one embodiment of this invention has been described, this description is not intended to be limiting and other embodiments will be obvious to those skilled in the art based on this disclosure. Thus, while this invention has been described as using a fusible link 11, the principles of this invention apply equally well to the use of any other fusible element, such as one or more PN junctions or a dielectric.

What is claimed is:

1. A semiconductor memory structure comprising:
   a memory cell capable of being set permanently in a first state or a second state, said cell normally being in said first state and having an output lead;
   means for determining the state of said memory cell, said means for determining comprising a read transistor having a collector connected to said output lead of said memory cell, a base for receiving an enable signal, and an emitter serving as an output node and providing a signal indicative of the state of said memory cell; and
   programming means comprising a first programming transistor having a collector connected to the output terminal of said memory cell, a base for receiving an enable signal, and an emitter, and a second programming transistor having a collector connected to said emitter of said first transistor, a base for receiving a programming voltage indicating the desired state of said memory cell, and an emitter connected to a reference voltage.

2. The structure as in claim 1 which further includes an inverter having an input lead connected to the emitter of said read transistor and an output lead serving to provide a signal indicating the state of said memory cell.

3. The structure as in claim 2 which further comprises a zener diode having an anode connected to said base of said second programming transistor and a cathode connected to the output lead of said inverter.

4. The structure as in claim 3 which further comprises a resistor having a first lead connected to said base of said read transistor and a second lead connected to an enable terminal for receiving an enable voltage, and a second zener diode having an anode connected to the base of said first programming transistor and a cathode connected to said enable terminal, wherein in response to a first enable voltage less than the zener breakdown voltage of said second zener diode said read transistor serves to determine the state of said cell, and in response to a second enable voltage greater than the zener breakdown voltage of said second zener diode said first programming transistor is enabled and wherein, when said first programming transistor is enabled, in response to a first programming voltage less than the zener breakdown voltage of said second zener diode said cell remains in said first state and in response to a second programming voltage greater than the zener breakdown voltage of said second zener diode said first and said second turn on and said cell is programmed to said second state.

5. The structure as in claim 1 wherein said read transistor is a Schottky transistor.

6. The structure as in claim 1 wherein said memory cell includes a fusible link, having a first and a second lead, said first state being when said fusible link is intact and said second state being when said fusible link is open.

7. The structure as in claim 6 wherein said memory cell further includes a bipolar transistor for accessing said fusible link, said bipolar transistor having a collector for connection to a voltage supply, a base for the receipt of an access signal, and an emitter connected to said first lead of said fusible link, said second lead of said fusible link serving as said output lead of said memory cell.

8. The structure as in claim 7 which further comprises at least one additional memory cell, having an output lead connected to said collector of said read transistor and said collector of said first programming transistor, wherein one of said memory cells is selected by providing an access signal to the base of said selected one of said memory cells, and the remainder of said memory cells remain deselected by not providing said access signal to the bases of said remainder of said memory cells.

* * * * *